United States Patent [19]

Mitoff et al.

[11] Patent Number: 4,732,780

[45] Date of Patent: Mar. 22, 1988

[54] METHOD OF MAKING HERMETIC FEEDTHROUGH IN CERAMIC SUBSTRATE

[75] Inventors: Stephan P. Mitoff, Clifton Park; Richard J. Charles, Schenectady; Wayne D. Pasco, Scotia, all of N.Y.

[73] Assignee: General Electric Company, Schenectady, N.Y.

[21] Appl. No.: 33,368

[22] Filed: Apr. 2, 1987

Related U.S. Application Data

[63] Continuation-in-part of Ser. No. 780,137, Sep. 26, 1985, Pat. No. 4,684,446.

[51] Int. Cl.$^4$ ............... H01L 21/88; H05K 3/10
[52] U.S. Cl. ..................... 427/125; 29/852; 204/15; 204/37.1; 427/96; 427/97; 427/123; 427/376.2; 427/376.3; 427/376.7
[58] Field of Search ............ 427/96, 97, 98, 123, 427/125, 376.2, 376.3, 376.6, 376.7, 383.5; 29/851, 852; 204/15, 37.1

[56] References Cited

U.S. PATENT DOCUMENTS

| | | | |
|---|---|---|---|
| 3,352,007 | 11/1967 | Charles | 29/599 |
| 4,206,254 | 6/1980 | Schmeckenbecher | 427/259 |
| 4,340,618 | 7/1982 | Fury et al. | 427/376.3 |
| 4,430,690 | 2/1984 | Chance et al. | 361/321 |
| 4,442,137 | 4/1984 | Kumar | 427/57 |
| 4,471,004 | 9/1984 | Kim | 427/88 |
| 4,510,000 | 4/1985 | Kumar et al. | 156/89 |
| 4,647,476 | 3/1987 | Anthony | 427/97 |

OTHER PUBLICATIONS

N. V. Frederick et al., A Simple Technique for Metalizing Boron Nitride, The Review of Scientific Instruments, vol. 40, No. 9, (Sep. 1969), 1240–1241.

L. L. Trager, Plating Improvements for Metallized Ceramics, Technical Notes, A Publication of RCA/Princeton, N.J., TN No. 907, 5/1972.

Schwartz & Wilcox, Laminated Ceramics, Proceedings Electronic Components Conference, 1967, pp. 17–26.

Primary Examiner—John F. Niebling
Assistant Examiner—William T. Leader
Attorney, Agent, or Firm—Jane M. Binkowski; James C. Davis, Jr.; James Magee, Jr.

[57] ABSTRACT

A process for producing an hermetic feedthrough in a ceramic substrate by providing a sheet of liquid phase sinterable ceramic composition having a feedthrough hole, filling the feedthrough hole with refractory metal metallization material, firing the resulting structure to produce a sintered substrate and adherent metallization wherein the metallization is comprised of continuous phases of refractory metal and glass, contacting the refractory metal with electrically conductive intrusion metal and heating the resulting structure to a temperature at which the glassy phase is fluid, the refractory metal is solid, and the intrusion metal is liquid whereby the liquid metal preferentially wets the refractory metal, migrates into the metallization displacing glass and, upon subsequent solidification, partially or wholly occupies the volume space originally containing the continuous glass phase.

23 Claims, 5 Drawing Figures

METHOD OF MAKING HERMETIC FEEDTHROUGH IN CERAMIC SUBSTRATE

This is a continuation-in-part of U.S. application Ser. No. 780,137 filed Sept. 26, 1985, now U.S. Pat. No. 4,684,446, and assigned to the assignee hereof.

This invention relates to a feedthrough in a ceramic substrate. In one aspect, this invention is directed to a feedthrough in a ceramic plate or substrate for an electrical device. In another aspect, this invention relates to a feedthrough in a ceramic substrate for an electronic device. In still another aspect, this invention relates to a feedthrough in a ceramic electronic package.

By a feedthrough herein it is meant electrically conductive means adhered in a hole in a ceramic substrate wherein the hole passes through the thickness of the substrate. The feedthrough is hermetically bonded to the substrate and is the means through which electric current passes therethrough.

Fabrication of a feedthrough in a ceramic substrate has been difficult. It requires a multiplicity of steps which are time-consuming. It also requires a multiplicity of materials making it expensive and generally resulting in a feedthrough which is not space conservative. Also, the use of several different materials makes it difficult to produce a feedthrough which has a suitable thermal match with the ceramic. For high current inputs, feedthroughs tend to heat up and may expand sufficiently to cause cracking and loss of hermeticity. To avoid such heat-up, relatively large feedthroughs frequently are fabricated. There is a need, particularly in power semiconductor chip packages, for a feedthrough with a thermal expansion which closely matches that of the ceramic. Also, because of fabrication procedures, the feedthrough usually is a metal other than copper.

An example of a feedthrough in a ceramic electronic package comprises firing a coating of molybdenum-manganese metallization on the surface of the feedthrough hole, then coating a nickel metal thereon, and then soldering the pin thereto by means of a glass seal.

The present feedthrough provides a number of advantages. It does not require the complex processing of the prior art. Its composition can be modified to obtain a thermal expansion which closely matches that of the ceramic substrate. If desired, it can contain a significant amount of copper. Also, it is space conservative.

Those skilled in the art will gain a further and better understanding of the present invention from the detailed description set forth below, considered in conjunction with the figures accompanying and forming a part of the specification, in which.

Figure 1:
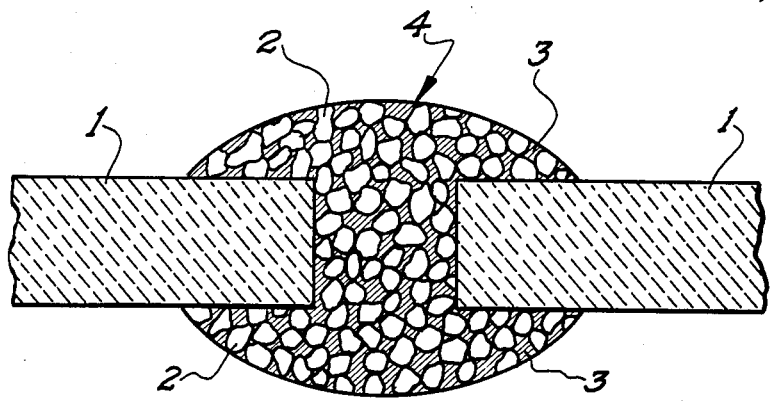
FIG. 1 is a cross-sectional view of one embodiment of the present feedthrough in ceramic substrate.

Briefly stated the present process for producing an hermetic feedthrough in a ceramic substrate comprises providing a sheet of a liquid phase sinterable ceramic composition having at least one feedthrough hole, filling or at least substantially filling said feedthrough hole with refractory metal metallization-forming material, firing the resulting structure to produce a sintered structure comprised of sintered ceramic substrate having an adherent electrically conductive refractory metal metallization in said feedthrough hole, said ceramic substrate containing at least about 1% by volume of glassy phase, said metallization being comprised of a continuous phase of refractory metal and a continuous phase of glass, said refractory metal ranging from about 25% by volume to about 75% by volume of said metallization, said liquid phase ceramic composition and said metallization-forming material being formulated to produce said sintered structure, contacting said refractory metal at at least one exposed portion of said metallization with an intrusion metal selected from the group consisting of copper, nickel, tin, gold, iron, cobalt, and alloy thereof, heating the resulting structure to an infiltration temperature which is above the transition temperature of said glass and at which said intrusion metal is liquid but said refractory metal is solid thereby infiltrating said liquid intrusion metal into said metallization, at said infiltration temperature said liquid metal preferentially wetting said refractory metal displacing said glass with said intrusion metal, and allowing the resulting structure to cool thereby solidifying said infiltrated liquid intrusion metal in place producing said feedthrough, said solid infiltrated intrusion metal at least partly occupying the volume space originally occupied by said displaced glass and being in contact with said refractory metal phase, said solid intrusion metal comprising at least about 25% by volume of said feedthrough, said process being carried out in an atmosphere which has no significant deleterious effect on said ceramic substrate, said refractory metal metallization and said intrusion metal.

In the present invention, the sinterable ceramic composition is one which can be liquid phase sintered at a temperature below the melting temperature of the refractory metal it is in contact with or supports during sintering. The ceramic composition should be non-reactive with the refractory and intrusion metals. The sinterable ceramic composition is comprised of ceramic powder and an amount of liquid-forming material which is at least sufficient to enable the liquid phase sintering of the ceramic powder to produce the present substrate having a porosity of less than about 10% by volume, usually less than about 5% by volume, of the substrate. Specifically, the liquid-forming material is a solid material which forms a liquid in situ at sintering temperature in an amount which enables liquid phase sintering of the ceramic composition to produce the present cofired sintered structure. Generally, the liquid-forming material is present in an amount of at least about 1% by weight, frequently ranging from about 1% by weight to about 15% by weight, and more frequently from about 2% by weight to about 10% by weight, of the sinterable ceramic composition.

Representative of useful ceramic powders is alumina, aluminum nitride, mullite-cordierite compositions and silicon nitride. Generally, the ceramic powder is alumina.

The particular composition of the liquid-forming material can vary widely and depends largely on the particular ceramic powder to be sintered and the particular composition desired in the sintered structure for a particular application. However, a portion of the liquid-forming material must be a glass-forming material and should be present in an amount sufficient to produce a ceramic substrate containing at least about 1% by volume of glassy phase. The specific liquid-forming composition can be determined empirically or it can be calculated by conventional techniques. A portion or all of the present liquid-forming material can be a known glass-forming composition.

Generally, the liquid phase sinterable ceramic composition is formulated to produce a sintered ceramic substrate containing a glassy phase which generally is continuous and which is present in an amount of at least about 1% by volume, usually at least about 2% by volume, of the ceramic body or substrate. Generally, the glassy phase ranges from about 1% by volume to about 20% by volume, frequently from about 2% by volume to about 20% by volume, or from about 10% by volume to about 20% by volume, of the ceramic body or substrate.

In carrying out the present process, a green sheet of the sinterable ceramic composition can be formed by a number of conventional techniques. Generally, the particulate ceramic composition is admixed with an organic binding material to form a uniform mixture or suspension which is formed into a sheet of desired thickness and solids content. The organic binding material bonds the particles together and enables formation of the sheet of desired thickness and solids content. The organic binding material is a thermoplastic material with a composition which can vary widely and which is well known in the art or can be determined empirically. It pyrolyzes, i.e. thermally decomposes, at an elevated temperature ranging generally from about 100° C. to 500° C.

Generally, the components are milled in an organic solvent in which the organic material is soluble, or at least partially soluble, to produce a castable mixture or suspension. Examples of suitable solvents are methyl ethyl ketone, toluene and alcohol. The mixture or suspension is then cast into a sheet of desired thickness in a conventional manner, usually by doctor blading which is a controlled spreading of the mixture or suspension on a carrier from which it can be easily released such as Mylar or Teflon. The cast sheet is dried to evaporate the solvent therefrom to produce the present green sheet which is then removed from the carrier.

The particle size of the solids content of the present mixture or suspension can vary widely depending largely on the particular substrate to be formed and is determinable empirically. Generally, the solids in the mixture and resulting green sheet have a specific surface area of less than about 10 $m^2/g$, and frequently from about 1.5 $m^2/g$ to about 4 $m^2/g$, according to BET surface area measurement.

The particular amount of organic binding material used in forming the mixture is determinable empirically and depends largely on the amount and distribution of solids desired in the resulting green sheet. Generally, the organic binding material ranges from about 25% by volume to about 50% by volume of the solids content of the mixture and green sheet.

The thickness of the present green sheet can vary widely depending largely on its particular application. Generally, however, its thickness ranges from about 0.1 mm to about 1 mm. Preferably, the present green sheet is of uniform or at least of substantially uniform thickness.

A feedthrough hole, i.e. a hole which passes through the thickness of the sheet, or a plurality of such holes can be formed in the green sheet by a number of conventional techniques. Usually, the feedthrough hole is punched through the sheet.

The size of the feedthrough hole in the green sheet can vary and is determinable empirically. Specifically, the diameter of the feedthrough hole depends upon the size of the feedthrough desired in the sintered ceramic substrate. At a minimum, the diameter of the feedthrough hole in the green sheet should be at least sufficient to allow the production of an electrically conductive sintered metallization therein in the resulting sintered structure. The shape of the feedthrough hole in the green sheet can vary, but generally, it is cylindrical and vertical. Preferably, it is of uniform or at least substantially uniform diameter.

The refractory metal metallization material is a material which, when dry, is a metallization-forming material, i.e. during the present cofiring the metallization-forming material forms an electrically conductive refractory metal phase. Generally, the metallization material is known in the art and is available commercially. Usually it is in the form of a paste or ink of the refractory metal particles suspended in organic binder and solvent. Generally, the refractory metal particles range in size from about 0.1 micron to about 20 microns. Frequently, the metallization material contains some glass frit to aid in the adherence of the metal to the substrate and formation of an hermetic bond. In addition, it may contain particles of the ceramic powder being sintered, usually alumina, in an amount controlled to impart a thermal expansion coefficient to the sintered metallization which is a closer match to that of the ceramic substrate. The specific composition of the metallization material is determinable empirically. On cofiring the green sheet wherein the feedthrough hole or holes are filled with dried metallization material, an electrically conductive metallization should be produced. Preferably, the compositions of the metallization-forming material and the liquid phase sinterable ceramic composition are formulated to produce a sintered structure with a metallization which is hermetic.

The refractory metal can be any metal whose particles can be sintered together during sintering of the present sinterable ceramic composition to produce a continuous electrically conductive phase. The refractory metal must be a solid during sintering of the ceramic composition, and preferably, it is tungsten or molybdenum. In the present process, the refractory metal should not react with the ceramic substrate or with the intrusion metal.

In the present process the metallization material can be deposited in the feedthrough hole of the sheet by a number of conventional techniques. Generally, a metal mask is positioned on the green sheet and the metallization material is forced with a squeegee through a hole or holes in the mask which correspond to feedthrough hole or holes in the sheet.

The feedthrough hole is filled with the metallization material so that when dry the resulting metallization-forming material is at least about level with the external surfaces of the sheet in order to produce a sintered metallization which is at least about level with the external surfaces of the resulting sintered substrate. Preferably, the compsitions of the dried metallization material and that of the sinterable ceramic composition are formulated so that on sintering their shrinkage is not significantly different thereby avoiding cracking on subsequent cooling and aiding in the production of an hermetic seal between the metallization and the substrate.

Preferably, thick metallization paste or inks containing at least about 50% by volume of refractory metal powder are used since they usually fill the feedthrough hole in one application, i.e. on drying they will not shrink significantly. On the other hand, thin pastes and inks contain much more solvent and would require more than one application to fill the hole since on drying they shrink significantly. An excess amount of metallization material can be deposited so that when dry it extends from one or both end portions of the filled feedthrough hole as desired to produce the desired sintered metallization which usually is of about the same shape. In a preferred embodiment, an excess amount of dry metallization material extends from one or both ends of the filled feedthrough hole and covers at least part, and preferably all, of the surrounding external surface area of the substrate, i.e. the rim portion of the substrate surface surrounding the hole, to produce a sintered metallization of about the same form. The excess amount of dry metallization material extending from the filled hole and covering the rim portion of the external surface of the sheet can be in a number of forms such as, for example, a mound or a plate, to produce a sintered metallization of about the same shape. The extended portion of the sintered metallization in contact with the external surface of the substrate is directly bonded to it by a bond formed in situ which results in a feedthrough with increased strength. Drying of the metallization material can be carried out in any conventional manner, for example, in air under ambient conditions or at elevated temperatures usually below 200° C., typically about 80° C. Where it has been determined that only one application of the metallization material is required to fill the hole in the green sheet, drying may be effected on cofiring the structure to produce the sintered structure.

The resulting structure is then cofired to produce a sintered structure comprised of a sintered ceramic substrate with an adherent, preferably hermetic, electrically conductive sintered metallization. The structure is sintered at a temperature at which the ceramic composition densifies to produce a ceramic substrate having a porosity of less than about 10% by volume.

During sintering, the ceramic powder is liquid-phase sintered producing a ceramic substrate of desired density, and the refractory metal particles are sintered together producing a continuous electrically conductive phase. During sintering, a portion of the liquid glassy phase which enables sintering of the ceramic migrates into the interstices between the sintering refractory metal particles by capillarity resulting in a glassy phase intermingled with at least part of the continuous phase of refractory metal which aids in the adherence of the refractory metal phase to the substrate and formation of an hermetic seal. Preferably, sufficient glassy phase is intermingled with refractory metal phase to form an intermixture which makes the sintered metallization hermetic. The sintering temperature can vary widely depending largely on the particular ceramic composition, but generally it is above 1300° C. and usually ranges from about 1350° C. to about 1900° C. For example, for a sinterable liquid phase alumina composition, it can range from about 1450° C. to about 1700° C.

In the present cofiring, the rate of heating is determinable empirically and depends largely on the thickness of the sample and on furnace characteristics. Generally, in the firing temperature range up to about 500° C., a slower heating rate is desirable because of the larger amount of gas generated at these temperatures by the decomposition of the organic binding material. Typically, the heating rate for a sample of less than about 6 mm thickness can range from about 1° C. per minute to about 8° C. per minute.

The present cofiring or sintering is carried out in an atmosphere in which the ceramic substrate and refractory metal are inert or substantially inert, i.e. an atmosphere which has no significant deleterious effect thereon. Specifically, the atmosphere should be nonoxidizing with respect to the refractory metal, non-reducing the ceramic substrate and oxidizing to carbonaceous species. Representative of a useful atmosphere is dissociated ammonia, nitrogen, hydrogen, a noble gas and mixtures thereof which contains sufficient water vapor to maintain said oxidizing and reducing conditions throughout the cofiring cycle. Preferably, the atmosphere is at ambient pressure.

Upon completion of the sintering, the resulting structure is allowed to cool, preferably to ambient temperature. The rate of cooling can vary depending largely on the particular composition and size of the structure and is determined empirically. It should have no significant deleterious effect on the structure, and frequently, it is furnace cooled to ambient temperature.

The present substrate has a porosity of less than about 10% by volume, preferably less than about 5% by volume, more preferably less than 1% by volume, and most preferably, it is pore-free, i.e., it is fully dense. Generally, the ceramic substrate is in the form of a flat plate, i.e. it generally has a pair of opposite surfaces or faces which are flat.

The sintered refractory metal metallization produced in the present process is comprised of a continuous phase of sintered refractory metal particles, a continuous phase of glass and possibly isolated crystals of ceramic if ceramic powder was present in the material used to form the metallization. Generally, the sintered refractory metal particles are present in an amount of at least about 25% by volume, usually ranging from about 25% by volume to about 75% by volume, frequently from about 35% by volume to about 55% by volume, of the volume of the metallization. As used herein, "by volume of the metallization" means by volume by the total volume occupied by the metallization. Generally, the glassy phase is present in an amount of at least about 25% by volume, usually ranging from about 25% by volume to about 75% by volume, frequently from about 45% by volume to about 65% by volume, of the volume of the metallization. Ceramic particles or crystals may range from 0 to about 30% by volume, frequently from about 5% by volume, of the metallization. Representative of these ceramic crystals is aluminum oxide.

The present continuous phase of sintered metal particles contains interstices between at least a significant number of refractory metal particles. Generally, more than 35% by volume and less than 75% by volume of the metallization contains interstices between the particles of continuous metal phase. Generally, a significant number of these interstices, and in one embodiment most of these interstices, contain glass in a significant amount and frequently they are filled with glass. Also, the interstices may contain ceramic crystals in a significant amount. For those cases where the interstices do not contain glass or ceramic, or are not completely filled with glass and ceramic crystals, the residual interstice volume is void.

The particular phase composition of the sintered metallization depends largely on starting compositions. In an embodiment in which the sintered metallization is not hermetic, it has a central portion comprised of refractory metal phase surrounded by an intermixture of refractory metal and glassy phase. In an embodiment in which the sintered metallization is hermetic, it is comprised of an intermixture of refractory metal and glassy phases. Generally, any ceramic crystals in the metallization are dispersed through it.

The refractory metal metallization is directly bonded or adhered to the ceramic substrate, i.e. the direct bond is formed in situ. At least part, and frequently all, of the direct bond is between glass and the ceramic substrate. However, frequently part of the direct bond is between the refractory metal and the ceramic substrate. On occasion, part of the direct bond may be between ceramic crystal which may be present in the metallization and the substrate. At least a portion of the refractory metal metallization is exposed to the ambient so that a direct contact can be made between the refractory metal and the present intrusion metal. In the present process, the continuous refractory metal phase retains its continuity.

The present intrusion metal is selected from the group consisting of copper, nickel, tin, gold, iron, cobalt and alloys thereof. The intrusion metal can be contacted with the refractory metal metallization by a number of conventional techniques which would provide a direct contact with at least a portion of the refractory metal. For example, a foil of the intrusion metal can be placed, i.e. deposited, on the metalliaztion. Also, the intrusion metal can be electroplated or electroless plated onto the metallization. In addition, an ink or paste of the intrusion metal, i.e. generally comprised of a suspension of particles of the intrusion metal in an organic medium, can be deposited, usually by screening, on the metallization. In another technique, the refractory metal can be contacted with the intrusion metal so that at infiltration temperature a pool of the liquid intrusion metal forms and its migration into the refractory metal is by capillarity. Preferably, the intrusion metal is contacted with only one end portion of the refractory metal metallization thereby providing better control of the infiltration. The intrusion metal can be contacted with or deposited on the refractory metal metallization in the amount desired for infiltration. During infiltration, the intrusion metal should not dissolve, or should not dissolve to any significant extent, in the refractory metal, and it should not react, or not react to any significant extent, with the refractory metal. Specifically, in the present process, the intrusion metal should not react with any of the components of the refractory metal metallization or the ceramic substrate, and it should not dissolve, or not dissolve to any significant extent, in any of the components of the refractory metal metallization or the ceramic substrate. Also, during infiltration, the intrusion metal should not form a stable oxide.

The resulting structure is heated to infiltration temperature which is above the transition temperature of the phase of glass of the metallization and at which the intrusion metal is liquid. Above its transition temperature, glass has a viscosity of less than $10^{13}$ poises and it is fluid. At infiltration temperature, the liquid metal preferentially wets the continuous refractory metal phase thereby migrating into and through the metallization displacing the fluid glass in at least a significant amount and leaving at least a significant amount of the intrusion metal. As it migrates on the continuous phase of sintered refractory metal particles, the liquid intrusion metal displaces glass in the interstices between the particles leaving intrusion metal therein and usually filling any voids therein.

The particular infiltration temperature depends on the particular composition of the glass and on the melting point or liquidus of the intrusion metal. Generally, the infiltration temperature ranges from higher than about 1300° C. to less than about 1550° C. Generally, the rate of infiltration increases with increasing infiltration temperature. At infiltration temperature the refractory metal is a solid. Also, preferably, at infiltration temperature there should be no significant vaporization of the intrusion metal. The infiltration temperature should have no significant deleterious effect on the ceramic substrate or on the refractory and intrusion metals.

During the present infiltration, the glassy phase in the ceramic substrate is above its transition temperature and liquid but the ceramic is solid thereby converting the substrate to a plastic state. However, in the present process, the body or structure comprised of the ceramic substrate with adherent metallization will not sag, or will not sag significantly, unless it is supported significantly or substantially unevenly. In one embodiment of the present process, the structure comprised of the ceramic substrate with adherent metallization is supported by support means which would prevent any significant distortion or deformation of the structure. For example, a flat surface or face of the structure or ceramic substrate can be supported on a flat surface of a support means and such support means may be horizontal or substantially vertical. In those cases where sticking between the metallization and the support means might occur, for example when the metallization overlaps the external peripheral portion of the substrate surface around the hole, flat pieces of the support means of the same thickness can be placed to contact and support the ceramic substrate but not touch its metallization and such support can be significantly or substantially even to prevent sagging, or any significant sagging of the structure of substrate. Also, the support means can be configured to support a sufficient portion of the edge surface of a ceramic substrate in a substantially vertical manner so that there is a downward force on all its weight which prevents it from sagging or sagging significantly.

In another embodiment of the present process, controlled deformation of the structure comprised of the ceramic substrate with adherent metallization can be carried out if the infiltration is carried out for a long enough time, determinable empirically, to produce a product for specific applications such as, for example, the preparation of spherical or parabloid concave surfaces for the mounting and interconnection of integrated opto-electronic devices. In such instance, for example, a structure in the form of a flat or substantially flat plate, i.e. a ceramic substrate with adherent metallization, would be supported on support means having the configuration which is to be imparted to the structure or ceramic substrate while the substrate is in a plastic state.

The support means should have no significant deleterious effect in the present process, i.e. it should be inert or substantially inert in the present process. Specifically, it should not react with the ceramic substrate, or with the refractory metal metallization or with the intrusion metal. Representative of such support means are metal oxides such as aluminum oxide and refractory metals such as tungsten and molybdenum.

The present infiltration process is carried out in an atmosphere in which the ceramic substrate and refractory and intrusion metals are inert or substantially inert, i.e. an atmosphere which has no significant deleterious effect thereon. Specifically, the atmosphere should be nonoxidizing with respect to the refractory and intrusion metals and the ceramic substrate. Preferably, the process is carried out in a dry atmosphere, i.e. an atmosphere having a dew point of at least 0° C. or lower. Representative of a useful atmosphere is nitrogen, hydrogen, a noble gas, preferably argon, and mixtures thereof. Preferably, a reducing atmosphere containing at least about 1% by volume of hydrogen, and more preferably at least about 5% by volume of hydrogen, is used to insure maintenance of sufficiently low oxygen partial pressure. Preferably, the atmosphere is at ambient pressure.

Upon completion of the infiltration, the resulting structure is allowed to cool thereby solidifying the infiltrated liquid intrusion metal in place and also solidifying the glass making the structure a solid. Preferably, it is cooled to ambient temperature. The rate of cooling can vary and is not critical, but it should have no significant deleterious effect on the structure. Preferably, it is furnace cooled to ambient temperature.

The period of time at infiltration temperature can vary depending largely on the particular infiltration temperature and the extent of infiltration desired. Generally, however, the time at infiltration temperature ranges from about 30 minutes to less than an hour.

Generally, during infiltration, the displaced fluid glass is pushed into the pores of the ceramic substrate which are next to or close to the metallization. When there are no substrate pores close to the metallization, or when these pores become filled with glass, the fluid glass is pushed to the external surface of the resulting feedthrough leaving small beads or bumps of glass thereon exposed to the ambient which ordinarily can be seen only under a microscope. These beads or bumps of glass can be left on the resulting feedthrough or, preferably, they can be removed in a conventional manner by light abrasion, laser tools or by chemical means.

As a result of the present infiltration, at least a sufficient amount of infiltrated intrusion metal is left in direct contact with the refractory metal to produce a feedthrough having an electrical conductance which is significantly higher than that of the refractory metal phase alone. Specifically, the infiltrated intrusion metal solidifes in place in contact with the refractory metal and occupies partially or wholly the volume space originally occupied by the displaced glass phase in the metallization. The amount of intrusion metal infiltrated into and/or through the refractory metal metallization can be controlled as desired. Preferably, infiltration is carried out until the intrusion metal has displaced most of the glass producing a metallic feedthrough containing glass in an amount of less than about 10% by volume, preferably less than about 5% by volume, of the feedthrough. Most preferably, infiltration is carried out until all of the glass has been displaced therefrom producing a totally metallic feedthrough frequently containing some amount of glass at one or both end surface portions thereof which are exposed to the ambient, and which can be removed in a conventional manner. If desired, infiltration is continued until there is a build-up of intrusion metal on an external surface of the feedthrough preferably in the form of a coating covering the external surface of the feedthrough at one or both end portions thereof. The coating of intrusion metal is adherent to the feedthrough, and preferably, it is continuous, free of holes, and covers the entire exposed surface of the feedthrough. The thickness of the intrusion metal coating can vary, but generally, it ranges from about 10 to about 100 microns.

The extent of infiltration can be determined by a number of techniques. For example, it can be determined empirically by determining the change in electrical resistance or conductivity of the infiltrated metallization. Also, observation of substantial color change at an end portion of the metallization may indicate that the intrusion metal is close to coating or building up on the refractory metal phase. The intrusion metal follows the path that an electric current will follow.

The present process is carried out to leave the infiltrated intrusion metal in contact with the refractory metal phase in at least a sufficient amount to produce a feedthrough having an electrical conductance which is at least about 10% higher, preferably at least about 50% higher, and more preferably at least about 100% higher than that of the non-infiltrated metallization.

The present feedthrough is integral and hermetic, i.e. it is airtight.

The present feedthrough is comprised of a continuous phase of sintered refractory metal particles and a continuous phase of intrusion metal which is in direct contact with the refractory metal phase at least through the length thereof. As a result of the present process, intrusion metal is left in the interstices of the refractory metal phase in contact with the refractory metal. Also, intrusion metal may coat the refractory metal phase, partly or entirely. An excess amount of the continuous phase of intrusion metal may be present at one or both end portions, i.e. external surface portions of the feedthrough, usually in the form of a coating.

The present feedthrough can be varied in composition depending largely on the properties desired. Generally, the refractory metal phase is present in an amount of at least about 25% by volume, usually ranging from about 25% by volume to about 75% by volume, frequently from about 35% by volume to about 55% by volume, of the total volume of the feedthrough. As used herein, "by volume of the feedthrough" means the total volume occupied by the feedthrough. Generally, the intrusion metal is present in an amount of at least about 25% volume, usually ranging from about 25% to about 75% by volume, frequently from about 30% to about 60% by volume, or from about 35% to about 50% by volume, or from about 45% by volume to about 65% by volume, of the feedthrough. Glass may be present in an amount ranging from 0 to about 10% by volume, or from 0 to about 5% by volume, of the feedthrough. Preferably, the feedthrough is free of glass. Ceramic particles or crystals may range from 0 to about 30% by volume, frequently from about 5% to about 15% by volume, of the feedthrough. Usually, the ceramic crystals are of the same composition as the ceramic powder which had been liquid phase sintered to produce the ceramic.

The feedthrough is hermetically bonded to the ceramic substrate by a direct bond thereto, i.e. it forms an interface therewith. On the side of the substrate, such a bond is comprised of a mixture of glass and ceramic. On the side of the feedthrough, such a bond can be entirely metallic which can be comprised of a mixture of a refractory metal and intrusion metal phases, or it can be comprised entirely of intrusion metal phase. The direct bond on the side of the feedthrough may also contain glass or ceramic crystals, or a mixture thereof.

The size of the feedthrough can vary. Generally, it ranges in diameter from about ⅛ to about 2½ times the thickness of the sintered substrate. Frequently, it ranges from about ¼ to about 2 times, or from about ½ to about 1½, and more frequently from about 1 to about 1½ times the thickness of the substrate.

The composition of the present feedthrough can be controlled to produce a feedthrough having a thermal expansion coefficient at 25° C. which is within about ±10%, preferably within about ±5%, and more preferably within about ±1% of that of the ceramic substrate.

The present product is particularly useful as a packaging component in power semiconductor chip packages.

If desired, the product can be brazed via the feedthrough to another metallic part making it useful as a socketed, or leaded device as part of a hybrid circuit. Also, one or more wires can be diffusion bonded to the feedthrough to produce a product useful for integrated circuit chip connection.

FIGS. 1 to 5 illustrate the product produced by the present invention.

FIG. 1 shows the sintered ceramic substrate 1 containing feedthrough 4 comprised of continuous refractory metal phase 2 and continuous intrusion metal phase 3.

Figure 2:
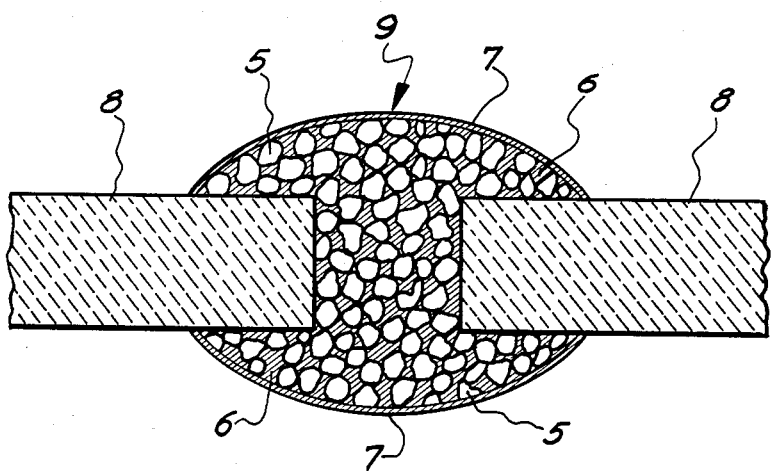
FIG. 2 is a cross-sectional view of another embodiment of the present feedthrough in ceramic substrate.

FIG. 2 shows the sintered ceramic substrate 8 containing feedthrough 9 comprised of continuous refractory metal phase 5 and continuous intrusion metal phase 6 which extends to form coating 7.

Figure 3:
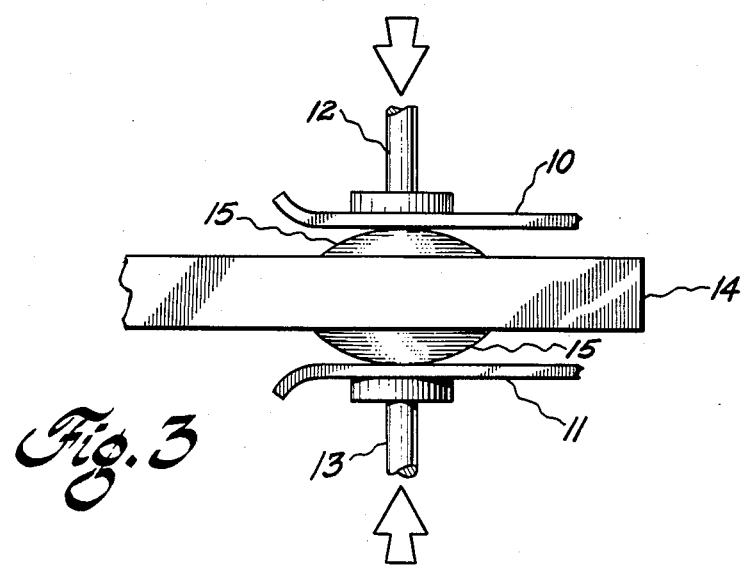
FIG. 3 is a schematic showing electrical contacts in direct contact with the present feedthrough.

FIG. 3 shows ceramic substrate 14 containing feedthrough 15 in direct contact with electrical contact 10 and 11 held in place by spring loads 12 and 13.

Figure 4:
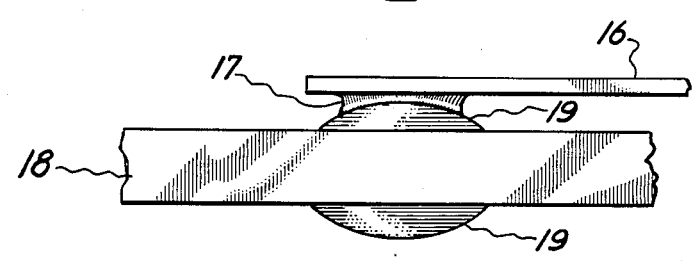
FIG. 4 is a schematic showing an electrical contact brazed to the feedthrough.

FIG. 4 shows ceramic substrate 18 containing feedthrough 19 wherein one end portion of feedthrough 19 is in electrical contact with electrical contact 16 by means of solder 17.

Figure 5:
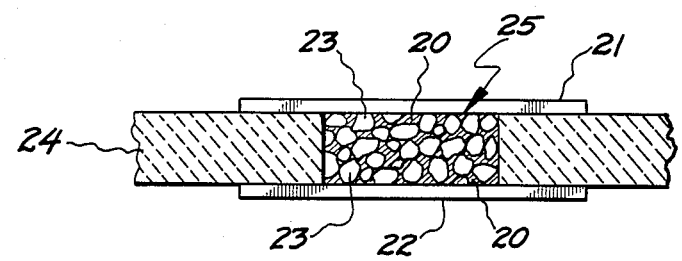
FIG. 5 is a cross-sectional view of another embodiment of the present feedthrough with electrical contact screen printed thereon.

FIG. 5 shows ceramic substrate 24 containing feedthrough 25 comprised of sintered continuous refractory metal phase 23 and continuous intrusion metal phase 20. The sides of feedthrough 20 are in direct contact with electrical contacts 21 and 22 which could be formed by screen printing. For example, a standard copper ink could be screen printed across the external surfaces of the feedthrough and onto the ceramic substrate and fired in a conventional manner to produce electrical contacts formed of copper.

The invention is further illustrated by the following examples wherein the procedure was as follows unless otherwise stated:

A molybdenum furnace was used.

Examples 1 to 20 correspond to Examples 1 to 20 of parent application Ser. No. 780,137 filed Sept. 26, 1985. In Examples 1 to 20, sintered multilayered ceramic chip carriers were used. Each carrier had a sintered refractory metal metallization on its opposed major surfaces which were interconnected by means of refractory metal metallization passing through the vias, i.e. feedthrough, holes in the substrate.

As used herein, in Examples 1 to 20, the footprint side or face of the substrate is opposite the top face of the substrate, i.e. the surface to which the silicon chip would be bonded.

The heating rate to the soak temperature, i.e. the infiltration temperature, was about 3 hours to temperature.

All of the examples were carried out in an atmosphere at ambient pressure.

In Examples 1 and 6–16, the dry atmosphere was comprised of a mixture of about 10% by volume hydrogen and about 90% by volume argon, and it was estimated to have a dew point of 0° C. or lower.

In Examples 1–10, the wet atmosphere was comprised of a mixture of about 10% by volume hydrogen and about 90% by volume argon, and the mixture was saturated with water at room temperature.

In Examples 1–17, before being placed in the furnace, each sample was placed on support means so that a face of the sample was substantially evenly supported. The support means was comprised of a high alumina ceramic comprised of 99% by volume alumina. Between a plaque of the supporting ceramic and each sample, there was placed flat pieces of the same thickness of the same ceramic so that there was no contact between the metallization and the ceramic support.

EXAMPLE 1

In Table I, Sample Type A was a co-fired, multi-layered ceramic chip carrier, about 0.4 inch square and about 0.1 inch thick. It was comprised of a high alumina ceramic substrate with adherent, electrically conductive tungsten metallization on both the footprint and top surfaces, and also in its vias and interconnects. The ceramic substrate was constructed of five layers and was comprised of about 87% by volume alumina, about 11% by volume glass and about 4% by volume porosity. The pores appeared to range from about 10 microns to about 20 microns in diameter and were distributed throughout the substrate. A significant number of these pores were present in the external surface portion of the ceramic substrate next to the metallization. The metallization was about 12.5 microns thick and was comprised of an intermixture of continuous phases of tungsten and glass. The metallization was comprised of about 60% to 65% by volume tungsten and the balance was glass, and it may have contained some pores but they were not observed. It has 24 independent circuits between the pads on the footprint and their counterparts on the top side of the ceramic substrate. The average measured resistance of the metallization before infiltration for sample Type A as measured between one of the pads on the footprint and its counterpart on the top side of the ceramic substrate was determined to be 160 milliohms.

The copper ink was comprised of finely comminuted copper particles in an organic vehicle containing copper in an amount of about 50% by volume of the ink. The copper ink was coated on the exposed metallization on the footprint side of the substrate only and dried in air leaving a coating thereon about 1 mm thick. The copper particles were in direct contact with at least a portion of the tungsten metal.

The resulting structure was placed on supporting means and heated in the dry atmosphere up to a soak temperature of 1450° C., and during this heating the organic residue from the ink decomposed leaving elemental copper. Upon reaching 1450° C., the wet atmosphere was substituted for the dry atmosphere, and the sample was held at 1450° C. for 30 minutes. It was then furnace-cooled in the wet atmosphere to ambient temperature.

Examination of the product showed copper in the metallization, i.e in direct contact with the tungsten, on both surfaces of the substrate which indicated that copper had been a liquid at soak temperature and had migrated through the metallization in the vias and into the metallization on the top side of the substrate. Significant variations in the concentration of copper in the metallization on the top side of the substrate were optically observed which indicated that the shorter individual electrical paths used less copper resulting in excess copper being left on both sides of that connection which appeared to be coated with copper. The sample showed no sag or distortion which could be detected by conventional means. Also, optical observation showed tiny bumps of glass mostly only on the metallization on the top surface obviously having been forced ahead of the displacing copper from the footprint which indicated that 1450° C. was above the transition temperature of the glassy phase of the metallization and that the fluid glass had been replaced with copper. Also, glass was observed in the pores next to the metallization which indicated that these pores had received some of the displaced glassy phase. The electrical resistance of the infiltrated metallization was measured between the same pad on the footprint and its counterpart on the top side of the ceramic substrate and it was determined to be 43 milliohms.

The infiltrated metallization was adherent to the ceramic substrate. The sample was cut and optical examination of its cross-section showed that copper had penetrated through all of the circuits in the sample and was present in or filled most of the interstices of the metallization. This indicated that a significant amount of copper displaced a significant amount of glass in the metallization which would inherently increase the electrical conductivity of the product by at least 100% and illustrates the present process. This example is illustrated in Table I.

All of the examples given in Table I were carried out in substantially the same manner except as shown in Table I and except as noted herein.

In all of the examples, the tungsten was a solid throughout the process.

Sample Type B of Table I had an average electrical resistance of 500 milliohms, as measured between a pair of castellations on the side of the sample, one of which was connected to the metallization of a pad on the footprint and the other to the corresponding finger on the top surface. It was a co-fired, multi-layered ceramic chip carrier, about 0.65 inch square and about 0.08 inch thick. It was comprised of a high alumina ceramic substrate with an adherent, electrically conductive tungsten metallization on both the footprint and top surfaces and also in its vias and interconnects. The substrate was constructed of four layers of ceramic and had 22 circuits. The metallization was about 12.5 microns thick. The composition of the ceramic substrate and the tungsten metallization was the same as in Sample Type A.

The copper ink given in Table I was the same as in Example 1 and was deposited in substantially the same manner as in Example 1.

In Table I, Atmosphere/Heating indicates the atmosphere in which the sample was heated up to the soak or infiltration temperature, and Atmosphere/Soak and Cool indicates the atmosphere in which the sample was heated at the soak temperature for the given time period and in which the sample was furnace-cooled to ambient temperature.

In Table I, Resistance After Treatment shows the resistance of a single circuit of the infiltrated metallization. In Sample Type A the same circuit was tested for resistance as disclosed in Example 1. In Sample Type B the same pair of castellations on the side of the sample were used to measure the resistance of the infiltrated metallization.

EXAMPLES 2-16 of TABLE I

Example 2 was carried out in substantially the same manner as Example 1 except that a wet atmosphere was used throughout the process. There was little or no penetration of copper which indicated that the wet atmosphere may have caused a deleterious effect between the copper and glass.

Example 3 was carried out in substantially the same manner as Example 2 except that Sample Type B was used.

In the Copper-Plated examples of Table I, i.e. Examples 4-7 and 9-13, copper was plated on all of the metallization on the footprint only of each sample. The electroplating was carried out in a conventional manner. The thickness of the copper plating was about the same in each example and was about 5 to 10 mils thick.

In Examples 4 and 5, where a wet atmosphere was used throughout the process, very little or no penetration occurred indicating that the atmosphere may have caused a deleterious effect between the copper and the glass.

In Examples 6-9, upon reaching soak temperature, a wet atmosphere was substituted for the dry atmosphere. Examples 6 to 9 illustrate the present invention and show that the electrical conductivity of the infiltrated circuit tested was increased by a significant amount. Specifically in Examples 6-8, optical examination of the surfaces of the products as well as their cross-sections showed that copper had infiltrated the metallizations in substantially the same manner as described in Example 1 and that there was direct contact between the copper and tungsten. In Example 9, optical examination of the surface of the product as well as its cross-section showed that copper had fully infiltrated all of the metallization of the sample as evidenced by its copper color. The samples of Examples 6-9 showed no sag or distortion which could be detected by conventional means.

In Example 10 a wet atmosphere was used until reaching 1450° C., and then a dry atmosphere was substituted.

In Examples 11-16, a dry atmosphere was used throughout the process.

Examples 11-15 illustrate the present process and the samples showed no sag or distortion which could be detected by conventional means. Specifically, in examples 11-13, the infiltration of copper into the metallization had significantly improved the electrical conductivity of the circuit tested. In Examples 11-13, optical examination of the surfaces of the products as well as their cross-sections showed that copper had fully infiltrated all of the metallizations of the samples and that copper was in direct contact with the tungsten phase and was present in the interstices of the continuous tungsten phase indicating that copper had been a liquid at soak temperatures. Also, glass was seen in the pores of the substrate next to the metallization which indicated that the soak temperature was above the transition temperature of the glassy phase of the metallization, that the glass was a fluid at soak temperature, and that it had been displaced and replaced with copper.

In Example 14, a 4 mil thick gold foil was deposited on the metallization on the footprint. Optical examination of the surface and cross-section of the product showed that gold had fully infiltrated all of the metallization of the sample, that it was in direct contact with the tungsten phase, and that at the soak temperature gold was a liquid. Glass was observed in the pores of the substrate next to the metallization indicating that at the soak temperature the glassy phase of the metallization was fluid and had been displaced and replaced by gold.

In Example 15, tin shot was deposited on the metallization on the footprint. In those areas where the shot did not roll off, there was good penetration through the vias to the metallization on the top surface of the sample. The penetration and presence of tin in the metallization indicated that tin was liquid at the soak temperature and that the glassy phase of the metallization was fluid and had been displaced and replaced with tin.

In Example 16, a 10 mil thick silver foil was placed on the metallization on the footprint only. The soak temperature was too high and evaporated the silver away.

weight of each sheet which prevented it from sagging. All of the sheets were heated to an infiltration temperature of 1450° C. where they were held for 45 minutes and then furnace cooled to ambient temperature. Only a dry atmosphere estimated to have a dew point of 0° C. or lower at ambient pressure was used and is shown in Table II.

The results are shown in Table II.

TABLE II

| Sheet | Copper Electroplating Time (minutes) | Average Copper Thickness (mils) | Atmosphere (vol %) | Resistance After Treatment (milliohms) | Penetration |
|---|---|---|---|---|---|
| #1 | 30 | 2 | 10% H$_2$ 90% Ar$_2$ | 55 | complete |
| #2 | 40 | 2.5 | " | 37 | complete |
| #3 | 50 | 3 | " | 45 | complete |
| #4 | 60 | 3.5 | 10% H$_2$ 90% N$_2$ | 50 | complete |

Optical examination of the surfaces of the infiltrated sheets as well as their cross-section showed that copper had infiltrated uniformly or substantially uniformly throughout the metallization and that it was in direct contact with the tungsten. This indicates that 1450° C. was above the transition temperature of the glass in the metallization and that the fluid glass had been displaced and replaced with copper. None of the sheets showed any sag or distortion which could be detected by conventional means. Also, glass was observed in the pores of the substrate next to the metallization which apparently received some of the displaced glass.

The average resistance of two sheets substantially similar to the starting sheets used in this example was

TABLE I

| Example | Type of Sample | Infiltrating Metal & Source | Atmosphere/ Heating | Atmosphere/ Soak & Cool | Soak Temperature | Soak Time (minutes) | Resistance After Treatment (milliohms) | Penetration |
|---|---|---|---|---|---|---|---|---|
| 1 | A | Copper-Ink | Dry | Wet | 1450° C. | 30 | 43 | good |
| 2 | A | Copper-Ink | Wet | Wet | 1450° C. | 30 | 170 | very little or none |
| 3 | B | Copper-Ink | Wet | Wet | 1450° C. | 30 | 500 | very little or none |
| 4 | A | Copper-Plated | Wet | Wet | 1450° C. | 45 | — | none |
| 5 | B | Copper-Plated | Wet | Wet | 1450° C. | 45 | 500 | none |
| 6 | B | Copper-Plated | Dry | Wet | 1450° C. | 30 | 265 | good |
| 7 | A | Copper-Plated | Dry | Wet | 1450° C. | 30 | 65 | good |
| 8 | A | Copper-Ink | Dry | Wet | 1450° C. | 30 | 43 | good |
| 9 | B | Copper-Plated | Dry | Wet | 1450° C. | 40 | 123 | complete |
| 10 | B | Copper-Plated | Wet | Dry | 1450° C. | 30 | no change | none |
| 11 | B | Copper-Plated | Dry | Dry | 1450° C. | 30 | 160 | complete |
| 12 | B | Copper-Plated | Dry | Dry | 1525° C. | 60 | 155 | complete |
| 13 | B | Copper-Plated | Dry | Dry | 1525° C. | 35 | 167 | complete |
| 14 | B | Gold-Foil | Dry | Dry | 1475° C. | 20 | 270 | complete |
| 15 | B | Tin-Shot | Dry | Dry | 1475° C. | 20 | 145 | hit or miss |
| 16 | B | Ag-Foil | Dry | Dry | 1475° C. | 20 | 500 | Ag evaporated |

EXAMPLE 17

Four sheets, each comprised of 96 squares of Sample Type A disclosed in Example 1, were used. All of the circuits in each sheet were interconnected. A commercially available organic laquer was coated on the top surface to prevent electroplating thereon. Copper was electroplated on the metallization on the footprint of each sheet in a conventional manner for a given time period. The laquer was then dissolved from the top surface by soaking the product in acetone. All of the sheets were positioned substantially vertically in a molybdenum support. Specifically, the configuration of the support was that of an upside-down table with a number of spaced legs which formed open slots. Each sheet was placed in a slot so that it was about 2 degrees from the vertical. This provided a downward force on the measured in the same way and in the same place as the resistance after treatment shown in Table II and found to be 114 and 131 milliohms. A comparison of these values with those in Table II illustrates the significant reduction in resistance provided by the present process.

EXAMPLE 18

In this example, a copper infiltrated sample was prepared substantially in the same manner as disclosed in Example 17. Optical examination of the infiltrated metallization showed that there were tiny bumps of glass on the surface of the metallization on the top side of the sample but none were seen on the metallization on the footprint.

The product was immersed in an aqueous 2% hydrofluoric acid solution at room temperature for about 2 minutes, then rinsed with water and dried. Optical examination of the metallization showed that the bumps of glass had been removed.

The product, i.e. metallization, was then plated in a conventional manner with nickel, about 1 μm thick, and then with gold, about 3 μm thick.

Two aluminum wires, one 1.2 mils in diameter and the other 2 mils in diameter, were then diffusion bonded to the metallization on the top side of the sample, i.e. to the fingers. The wires were then pulled away from the metallization and broke apart leaving the metallization adherent to the surface.

EXAMPLE 19

A series of tungsten metallized, three-layer chip carriers, on which all the exposed metallization surfaces were plated with nickel only (i.e. as received), were used in this example. Specifically, each carrier was the same and was comprised of ceramic substrate with adherent tungsten metallization plated with nickel. The substrate was comprised of about 91% by weight alumina, about 15% by volume glass and contained minor amounts of silica, magnesia and calcia. The substrate had a porosity of about 7% by volume with pores ranging from about 5μ to about 25μ in diameter. The pores were distributed throughout the substrate and a significant number of them were present in the external surface portion of the substrate next to the tungsten metallization. The tungsten metallization was about 18 microns thick and was comprised of an intermixture of continuous phases of tungsten and glass. The tungsten metallization was comprised of roughly about 60% by volume tungsten and the balance was glass and it may have contained some pores. It had an average electrical conductivity of about 0.132 milliohms per square.

Each carrier was placed on a molybdenum plate so that a face of the carrier was supported by the flat surface of the plate and heated to a given temperature for a given time period in a dry hydrogen atmosphere with a dew point of −30° C. at ambient pressure and then furnace cooled to ambient pressure.

Optical examination of the sample which had been fired at 1250° C. for one hour as well as the sample which had been fired at 1350° C. for one hour showed no penetration of the tungsten metallization with nickel.

Optical examination of the sample which had been fired at about 1450° C. for 30 minutes showed that nickel had penetrated all internal and external tungsten metallizations displacing and replacing the glass therein. This indicated that the nickel was a liquid at the firing temperature and the glassy phase of the metallization was fluid. No sagging of the substrate was detectable by conventional means. Specifically, except for the vias, the nickel had displaced and replaced virtually all of the glassy phase of the tungsten metallization as was evident from its nickel color. Glass was seen in the pores of the substrate next to the metallization indicating that the pores had received some of the displaced glass. Penetration and glass displacement by the nickel was also observed in the vias of this part but complete or substantial filling of the vias with nickel was not possible due to the presence of alumina body material used in vias filling tungsten ink screening.

EXAMPLE 20

A section of a tungsten metallized, three-layer (20 mils/layer) chip carrier containing a 19 millimeter straight buried trace tungsten metallization with side branches was used. The carrier was comprised of a ceramic substrate and adherent tungsten metallization. The ceramic substrate was substantially of the same type disclosed in Example 19, i.e. it was comprised of about 91% by weight alumina and about 15% by volume glass and had a porosity of about 7% by volume. The buried tungsten metallization trace was about 18μ thick and 400μ wide and was comprised of an intermixture of continuous phases of about 60% by volume tungsten and about 40% by volume glass.

The carrier was electroplated in a conventional manner with nickel about 0.1 mm thick, on the metallization on the external surfaces where the buried trace side brahcnes were intersected and cut by diamond saw sectioning. After measurement of the electrical resistance of the straight buried trace (363 milliohms corresponding to 0.132 millohms per square), the sample was placed on the flat surface of a molybdenum plate and heated to 1450° C. in dry hydrogen with a dew point of −30° C., held at 1450° C. for about one-half hour, and then furnace cooled to ambient. No sagging of the sample was detectable by conventional means. Optical examination of the sample showed that excess surface nickel balled up and exuded glass was evident which attached the Ni balls to the surfaces of the sample at trace exit points indicating that at the firing temperature the nickel was fluid and the glassy phase of the metallization was fluid. Polishing of the side branch metallizations at their exit points showed that complete glass displacement and Ni metal substitution had been achieved. Subsequent electrical measurements and analyses of the long trace conductivity showed that the trace electrical conductivity had been increased by 31% from the value in the initial glass bonded state (i.e. from 0.132 milliohms per square to 0.172 milliohms per square).

EXAMPLE 21

An alumina green sheet was produced in a conventional manner. It had a thickness of 0.035 inch and was of the type used for production of sintered multi-layer ceramic substrate. Specifically, the green sheet was comprised of liquid phase sinterable ceramic composition and some organic binder and was formulated to produce a dense sintered ceramic substrate. The ceramic composition was comprised of alumina powder and glass-forming material and was formulated to produce a dense sintered ceramic substrate.

The green sheet was cut into small squares, about one inch, and a feedthrough hole, about 1/16 inch in diameter, was drilled through each square.

A commerically available tungsten trace ink was used which was comprised of about 25% by volume of tungsten powder suspended in an organic medium which contained trace amounts of alumina particles.

The ink was forced into the feedthrough hole with a spatula under ambient conditions. The resulting structure was dried in an air oven at about 100° C. for a few minutes.

The dried structure showed that the ink had shrunk significantly. This procedure was then repeated about five times until the dried ink filled the hole and covered the rims of the hole forming a mound over each end portion of the hole producing the configuration shown in FIG. 1.

Three samples, A, B, and C, were prepared in this manner.

The samples were fired in a moist 75% hydrogen-25% nitrogen atmosphere at 1660° C. for 80 minutes and then were furnace cooled to ambient temperature. The dew point of the hydrogen-nitrogen atmosphere was varied with furnace temperature according to a standard schedule to prevent oxidation of the molybdenum furnace and tungsten metallization and reduction of the ceramic.

The sintered ceramic substrate was comprised of about 86% by volume alumina and about 10% by volume of glass and had a porosity of about 4%. It was calculated that the refractory metalmetallization contained about 60% by volume tungsten and about 40% by volume glass.

For the other work the electrical resistance of the metallization of sample A was estimated to be about 30 microohms.

Commercially available copper ink comprised of about 25% by volume of copper powder dispersed in an organic medium was used. An amount of the copper ink was deposited with a spatula on one end portion of the metallization of samples A and B which was approximated to infiltrate copper in a volume which was about two times the volume of the porosity of each metallization. This is indicated as heavy copper in Table III.

An amount of the copper ink was deposited on one end portion of the metallization in sample C which would infiltrate copper in a volume approximated to just fill the pores of the sintered metallization. This is indicated as light copper in Table III.

The resulting three samples were then heated to 1450° C. in a dry atmosphere of nitrogen-10% hydrogen at about ambient pressure where they were maintained for about 45 minutes and then furnace cooled to ambient temperature.

Samples A and B are illustrated in FIG. 2. Each was surrounded with a copper metal phase as shown by coating 7 in FIG. 2.

All three samples were subjected to a standard helium leak test. Sample A was found to be hermetic but samples B and C leaked.

The electrical resistance of sample A was measured to be 10 microohms and therefore suitable as an interconnection for a high power device.

Optical examination under microscope of a cross section of sample A showed that the feedthrough was comprised of about 60% by volume of tungsten phase and 40% by volume copper phase. No glass was detectable within the feedthrough although a few small bumps of glass were seen on the external surface of the copper coating. The feedthrough formed an interface with the ceramic substrate. The substrate side of the interface was comprised of alumina and glass. The feedthrough side of the interface appeared to be totally metallic and was comprised mostly of copper and partly of tungsten.

EXAMPLE 22

This Example was carried out in substantially the same manner as Example 21 except that tungsten via ink was used. This ink was substantially the same as the trace ink used in Example 21 except that it also contained a significant amount of alumina particles.

The via ink required only about two to three applications before the dried ink produced a filled hole covering the rims with a configuration as shown in FIG. 1.

The resulting infiltrated samples D and E were not hermetic.

EXAMPLE 23

This Example was carried out in substantially the same manner as Example 21 except that to the trace ink used in Example 21, there was added tungsten powder in an amount of about 30% by volume of the ink to produce a paste. Also, only one application of this paste was used to fill the hole and cover the rims with a mound of paste to produce a dried paste in the configuration shown in FIG. 1.

The resulting infiltrated samples F and G were not hermetic.

EXAMPLE 24

This Example was carried out in substantially the same manner as Example 21 except that to the trace ink there was added tungsten powder in an amount of about 60% by volume of the ink to produce a paste. Also, only one application of this paste was used to fill the hole and cover the rims with a mound of paste to produce a dried paste in the configuration shown in FIG. 1.

The resulting infiltrated samples H and I were hermetic.

However, infiltrated samples J and K leaked.

Microscopic examination of sample J showed that the pores in the tungsten metallization were not completely filled with copper, indicating that the estimation of the amount of copper required to fill the pores was too small to obtain hermeticity since the starting compositions, on sintering, did not produce a hermetic composition.

Examples 21-24 are illustrated in Table III.

TABLE III

| Ex. | Metallization Material | Heavy Copper Infiltration (2 × porosity) | Light Copper Infiltration (approximated to just fill pores) |
|---|---|---|---|
| 21 | Trace Ink 5-6 Applications | Sample A-hermetic Sample B-leaked | Sample C-leaked |
| 22 | Via Ink 2-3 Applications | Sample D-leaked | Sample E-leaked |
| 23 | Trace Ink plus 30 vol % W powder 1 application | Sample F-leaked | Sample G-leaked |
| 24 | Trace Ink plus 60 vol % W powder 1 application | Sample H-hermetic Sample I-hermetic | Sample J-leaked Sample K-leaked |

What is claimed is:

1. A process for forming an hermetic feedthrough in a ceramic substrate which comprises providing a sheet of a liquid phase sinterable ceramic composition having a feedthrough hole, at least substantially filling said feedthrough hole with a refractory metal metallization-forming material, firing the resulting structure to produce a sintered structure comprised of a sintered ceramic substrate having an electrically conductive refractory metal metallization, said ceramic substrate containing at least about 1% by volume of glassy phase, said metallization being comprised of a continuous phase of refractory metal and a continuous phase of glass, said refractory metal ranging from about 25% by volume to about 75% by volume of said metallization, said liquid phase ceramic composition and said metallization-forming material being formulated to produce said sintered structure, contacting said refractory metal at at least one exposed portion of said metallization with an intrusion metal selected from the group consisting of copper, nickel, tin, gold, iron, cobalt, and an alloy thereof, heating the resulting structure to an infiltration temperature which is above the transition temperature of said glass and at which said intrusion metal is liquid but said refractory metal is solid thereby infiltrating said liquid intrusion metal into said metallization, at said infiltration temperature said liquid metal preferentially wetting said refractory metal displacing said glass with said intrusion metal, and allowing the resulting structure to cool thereby solidifying said infiltrated liquid intrusion metal in place producing said feedthrough, said solid infiltrated intrusion metal at least partly occupying the volume space originally occupied by said displaced glass and being in contact with said refractory metal phase, said solid intrusion metal comprising at least about 25% by volume of said feedthrough, said process being carried out in an atmosphere which has no significant deleterious effect on said ceramic substrate, said refractory metal metallization and said intrusion metal.

2. The process according to claim 1 wherein said refractory metal is selected from the group consisting of tungsten and molybdenum.

3. The process according to claim 1 wherein said sintered ceramic substrate containing at least about 1% by volume of glassy phase is selected from the group consisting of alumina, aluminum nitride, and mullite-cordierite composition and silicon nitride.

4. The process according to claim 1 wherein the resulting feedthrough contains glass in an amount ranging to about 10% by volume of said feedthrough.

5. The process according to claim 1 wherein said intrusion metal is copper.

6. The process according to claim 1 wherein said infiltration is carried out sufficiently to produce a coating of said intrusion metal over the entire external exposed surface of said refractory metal metallization leaving none of said refractory metal metallization exposed.

7. The process according to claim 1 wherein said metallization-forming material extends to the external surface area of said sheet surrounding said feedthrough hole.

8. A process for forming an hermetic feedthrough in a ceramic substrate which comprises providing a sheet of a liquid phase sinterable ceramic composition having a feedthrough hole, at least substantially filling said feedthrough hole with a refractory metal metallization-forming material, firing the resulting structure to produce a sintered structure comprised of a sintered ceramic substrate having an hermetic electrically conductive refractory metal metallization, said ceramic substrate containing at least about 1% by volume of glassy phase, said metallization being comprised of an intermixture of a continuous phase of refractory metal and a continuous phase of glass, said refractory metal ranging from about 25% by volume to about 75% by volume of said metallization, said liquid phase ceramic composition and said metallization-forming material being formulated to produce said sintered structure, contacting said refractory metal at at least one exposed portion of said metallization with an intrusion metal selected from the group consisting of copper, nickel, tin, gold, iron, cobalt, and an alloy thereof, heating the resulting structure to an infiltration temperature which is above the transition temperature of said glass and at which said intrusion metal is liquid but said refractory metal is solid thereby infiltrating said liquid intrusion metal into said metallization, at said infiltration temperature said liquid metal preferentially wetting said refractory metal displacing said glass with said intrusion metal, and allowing the resulting structure to cool thereby solidifying said infiltrated liquid intrusion metal in place producing said feedthrough, said solid infiltrated intrusion metal at least partly occupying the volume space originally occupied by said displaced glass and being in contact with said refractory metal phase, said solid intrusion metal comprising at least about 25% by volume of said feedthrough, said process being carried out in an atmosphere which has no significant deleterious effect on said ceramic substrate, said refractory metal metallization and said intrusion metal.

9. The process according to claim 8 wherein said refractory metal is selected from the group consisting of tungsten and molybdenum.

10. The process according to claim 8 wherein said sintered ceramic substrate containing at least about 1% by volume of glassy phase is selected from the group consisting of alumina, aluminum nitride, and mullite-cordierite composition and silicon nitride.

11. The process according to claim 8 wherein the resulting feedthrough contains glass in an amount ranging to about 10% by volume of said feedthrough.

12. The process according to claim 8 wherein said intrusion metal is copper.

13. The process according to claim 8 wherein said infiltration is carried out sufficiently to produce a coating of said intrusion metal over the entire external exposed surface of said refractory metal metallization leaving none of said refractory metal metallization exposed.

14. The process according to claim 8 wherein said metallization-forming material extends to the external surface area of said sheet surrounding said feedthrough hole.

15. A process for forming an hermetic feedthrough in a ceramic substrate which comprises providing a sintered structure comprised of a sintered ceramic substrate having an electrically conductive refractory metal metallization in a feedthrough hole therein, said ceramic substrate containing at least about 1% by volume of glassy phase, said metallization being comprised of a continuous phase of refractory metal and a continuous phase of glass, said refractory metal ranging from about 25% by volume to about 75% by volume of said metallization, said ceramic substrate and said metallization being formulated to produce said sintered structure, contacting said refractory metal at at least one exposed portion of said metallization with an intrusion metal selected from the group consisting of copper, nickel, tin, gold, iron, cobalt, and an alloy thereof, heating the resulting structure to an infiltration temperature which is above the transition temperature of said glass and at which said intrusion metal is liquid but said refractory metal is solid thereby infiltrating said liquid intrusion metal into said metallization, at said infiltration temperature said liquid metal preferentially wetting said refractory metal displacing said glass with said intrusion metal, and allowing the resulting structure to cool thereby solidifying said infiltrated liquid intrusion metal in place producing said feedthrough, said solid infiltrated intrusion metal at least partly occupying the volume space originally occupied by said displaced glass and being in contact with said refractory metal phase, said solid intrusion metal comprising at least about 25% by volume of said feedthrough, said process being carried out in an atmosphere which has no significant deleterious effect on said ceramic substrate, said refractory metal metallization and said intrusion metal.

16. The process according to claim 15 wherein said metallization is non-hermetic and wherein at least sufficient extrusion metal is infiltrated therein to make said feedthrough hermetic.

17. The process according to claim 15 wherein said metallization is hermetic and is comprised of an intermixture of a continuous phase of refractory metal and a continuous phase of glass.

18. The process according to claim 15 wherein said refractory metal is selected from the group consisting of tungsten and molybdenum.

19. The process according to claim 15 wherein said ceramic substrate is selected from the group consisting of alumina, aluminum nitride, mullite-cordierite composition and silicon nitride.

20. The process according to claim 15 wherein the resulting feedthrough contains glass in an amount ranging to about 10% by volume of said feedthrough.

21. The process according to claim 15 wherein said intrusion metal is copper.

22. The process according to claim 15 wherein said infiltration is carried out sufficiently to produce a coating of said intrusion metal over the entire external exposed surface of said refractory metallization leaving none of said refractory metal metallization exposed.

23. The process according to claim 15 wherein said metallization extends to the external surface area of said substrate.

* * * * *